United States Patent [19]

Phomsakha et al.

[11] Patent Number: 5,607,506
[45] Date of Patent: Mar. 4, 1997

[54] GROWING CRYSTALLINE SAPPHIRE FIBERS BY LASER HEATED PEDESTAL TECHIQUES

[75] Inventors: Vongvilay Phomsakha, St. Petersburg; Robert S. F. Chang; Nicholas I. Djeu, both of Tampa, all of Fla.

[73] Assignee: University of South Florida, Tampa, Fla.

[21] Appl. No.: 327,454

[22] Filed: Oct. 21, 1994

[51] Int. Cl.$^6$ ..................................................... C30B 13/22
[52] U.S. Cl. ............................. 117/33; 117/34; 117/222; 117/904; 117/950
[58] Field of Search ............................. 117/33, 34, 222, 117/904, 950

[56] References Cited

U.S. PATENT DOCUMENTS

| | | |
|---|---|---|
| 3,865,564 | 2/1975 | Jaeger et al. . |
| 3,939,035 | 2/1976 | Keller . |
| 3,944,640 | 3/1976 | Haggerty et al. . |
| 4,040,890 | 8/1977 | Burrus et al. ........................... 117/904 |
| 4,421,721 | 12/1983 | Byer et al. . |
| 4,532,000 | 7/1985 | Harrington et al. . |
| 4,537,653 | 8/1985 | Teraishi . |
| 4,607,776 | 8/1986 | Nightingale et al. . |

(List continued on next page.)

FOREIGN PATENT DOCUMENTS

| | | | |
|---|---|---|---|
| 62-243314 | 11/1987 | Japan ..................................... | 117/904 |
| 8912031 | 12/1989 | WIPO ..................................... | 117/904 |

OTHER PUBLICATIONS

Characterization of Single Crystal Fibers for Optical Power Delivery Systems, D. H. Jundt, M. M. Fejer, and R. L. Byer, Applied Physics Department, Stanford University, Stanford, California 94305 (Received 11 Aug. 1989; accepted for publication 18 Sep. 1989).

Loss–loss Single–Crystal Sapphire Optical Fibers, G. A. Magel, D. H. Jundt, M. M. Fejer and R. L. Dyer, Applied Physics Department, Stanford University, Stanford California 94305, SPIE vol. 618 Infrared Optical Materials and Fibers IV (1986).

(List continued on next page.)

*Primary Examiner*—Robert Kunemund
*Attorney, Agent, or Firm*—Calfee, Halter & Griswold

[57] ABSTRACT

An improved system and process for growing crystal fibers comprising a means for creating a laser beam having a substantially constant intensity profile through its cross sectional area, means for directing the laser beam at a portion of solid feed material located within a fiber growth chamber to form molten feed material, means to support a seed fiber above the molten feed material, means to translate the seed fiber towards and away from the molten feed material so that the seed fiber can make contact with the molten feed material, fuse to the molten feed material and then be withdrawn away from the molten feed material whereby the molten feed material is drawn off in the form of a crystal fiber. The means for creating a laser beam having a substantially constant intensity profile through its cross sectional area includes transforming a previously generated laser beam having a conventional gaussian intensity profile through its cross sectional area into a laser beam having a substantially constant intensity profile through its cross sectional area by passing the previously generated laser beam through a graded reflectivity mirror. The means for directing the laser beam at a portion of solid feed material is configured to direct the laser beam at a target zone which contains the molten feed material and a portion of crystal fiber drawn off the molten feed material by the seed fiber. The means to support the seed fiber above the molten feed material is positioned at a predetermined height above the molten feed material. This predetermined height provides the seed fiber with sufficient length and sufficient resiliency so that surface tension in the molten feed material can move the seed fiber to the center of the molten feed material irrespective of where the seed fiber makes contact with the molten feed material. The internal atmosphere of the fiber growth chamber is composed substantially of Helium gas.

25 Claims, 4 Drawing Sheets

U.S. PATENT DOCUMENTS

| | | |
|---|---|---|
| 4,650,322 | 3/1987 | Fejer et al. . |
| 4,707,217 | 11/1987 | Aklufi ............ 117/904 |
| 4,981,549 | 1/1991 | Yamashita et al. . |
| 5,037,181 | 8/1991 | Byer et al. . |
| 5,077,087 | 12/1991 | Byer et al. . |
| 5,235,605 | 8/1993 | Rines et al. . |
| 5,260,964 | 11/1993 | Morin et al. . |
| 5,264,189 | 11/1993 | Yamashita et al. . |
| 5,283,692 | 2/1994 | Herbst . |

OTHER PUBLICATIONS

"Characterization of single–crystal sapphire fibers for optical power delivery systems" by Jundt, et al., Appl. Phys. Lett. 55(21) 20 Nov. 1989.

"Development of High Optical Quality High Temperature Sapphire Fibers" by Chang, Final Tech. Report submitted to NASA, Oct. 1993.

Takagi et al, "Crystal Growth of Sapphire Filaments By a Laser–Heated Floatiing Zone Technique", Jour. Mat. Sci vol. 12 (No. 3) Mar. 1977 pp. 517–521.

Flori et al, "Graded Reflectance Mirrors and Phase–unifying Mirrors for Keli Lasers", Purc. Applic. Opt. (1994) vol. 3(4) pp. 417–426 abs only.

GROWING CRYSTALLINE SAPPHIRE FIBERS BY LASER HEATED PEDESTAL TECHIQUES

GOVERNMENT SUPPORT

The invention was made with Government support under Grant No. N00014-092-J-1864 awarded by the Navy Department. The Government has certain rights in the invention.

TECHNICAL FIELD

The invention relates to the growing of crystal fibers, and particularly to the growing of sapphire crystal fibers having good transmission quality.

BACKGROUND OF THE INVENTION

Because of their inherent physical properties and waveguiding capability, single crystal fibers have been shown to have utility in a wide range of optical devices. For example, such fibers can be used in lasers or as sensors in corrosive or high temperature environments where traditional fiber sensors would be inoperative. In the medical field they can be used as a vehicle for delivering radiation to minute target areas. Sapphire ($Al_2O_3$) crystal fiber is extremely useful in such applications due to its unique physical properties. Specifically, it has a high melting point, a very low solubility in water, can transmit radiation possessing a wide range of wavelengths (300 nm-4 um), and is strongly resistant to any chemical interaction with its environment.

A known system for growing sapphire fibers was developed at Stanford University and is known as a Laser Heated Pedestal Growth system (hereinafter referred to as the "Stanford System"). This Stanford System is believed to be similar to the system disclosed in U.S. Pat. No. 4,421,721. The operation of the system disclosed in U.S. Pat. No. 4,421,721 involves the initial transformation of a previously generated laser beam having a conventional gaussian intensity profile through its cross sectional area into a laser beam having an annular intensity profile through its cross sectional area via a refraxicon. This laser beam is then focused onto the tip of a solid feed material producing molten feed material. A seed fiber is translated towards this molten feed material and makes contact with this molten feed material. Upon contact, the seed fiber fuses with the molten feed material. The seed fiber fused to the molten feed material is then withdrawn from the molten feed material whereby molten feed material is drawn off in the form of a crystal fiber. However, prior to its translation towards and ultimate fusion with the molten feed material, the seed fiber must be concentrically aligned with the solid feed material in order to produce a high quality crystal fiber. If this alignment is off, the resulting crystal fiber produced will have a non-uniform diameter and hence poor transmission quality. Since the diameters of both the seed fiber and the molten feed material typically range from 100 um to 300 um, this concentric alignment requires great skill on the part of the system's operator. The production of crystal fibers with this system occurs in an air atmosphere at standard atmospheric pressure.

An article co-authored by one of the joint inventors of U.S. Pat. No. 4,421,721 entitled "Characterization of single crystal sapphire fibers for optical power delivery systems" (Appl. Phys. Lett. 55(21), 20 Nov. 1989) provides information regarding the speed at which the Stanford System can grow good optical quality sapphire fibers and their potential application in the medical field. Specifically, the article states the Stanford System "typically" grows good optical quality sapphire crystal fibers at a rate on the order of 4 mm/minute. The article also explained medical applications for sapphire crystal fibers require a crystal fiber with a length of 4 meters. Hence the duration of time needed to grow such crystal fibers with the Stanford System would be approximately 16.7 hours. In applicants' opinion this protracted growth makes the cost of such sapphire crystal fibers prohibitively expensive and ultimately limits their application in medical and other fields.

SUMMARY OF THE INVENTION

The present invention provides a new and useful process and system for growing crystal fibers. Specifically, the system and process are designed to grow crystal fibers of excellent optical quality at a faster rate than previous techniques have grown such crystal fibers. The design of the present invention includes means for creating a laser beam having a substantially constant intensity profile through its cross sectional area; a fiber growth chamber with an internal atmosphere composed substantially of Helium gas; means located within the fiber growth chamber to support a seed fiber above the solid feed material; means for directing the second laser beam at a target zone which contains solid feed material to form molten feed material; means to translate the seed fiber towards and away from the molten material so that the seed fiber can make contact with the molten feed material, fuse to the molten feed material, and then be withdrawn away from the molten feed material whereby the molten feed material is drawn off in the form of a crystal fiber by the seed fiber. The target zone in the present invention contains the molten feed material and a portion of crystal fiber.

Certain aspects of the present invention are believed to provide improvements to presently known systems and processes for growing crystal fibers. For example, according to one aspect of the present invention, a laser beam having a substantially constant intensity profile through its cross sectional area is created by passing a previously generated laser beam having a conventional gaussian intensity profile through its cross sectional area through a graded reflectivity mirror. The graded reflectivity mirror's reflectivity is non-uniform and varies as a function of the radial distance from its center. As a result, the previously generated laser beam having a conventional gaussian intensity profile through its cross sectional area is transformed into a laser beam having a substantially constant intensity profile through its cross sectional area. This aspect of the present invention is in contrast to the system disclosed in U.S. Pat. No. 4,421,721 wherein a refraxicon was used to transform previously generated laser beam having a conventional gaussian intensity profile through its cross sectional area into a laser beam having an annular intensity profile through its cross sectional area.

Another aspect of the present invention is the direction of the laser beam having a substantially constant intensity profile through its cross sectional area at a target zone which contains the molten feed material and a portion of crystal fiber drawn off by the seed fiber. As a result, the second laser beam impinges concurrently on the molten feed material and a portion of newly grown crystal fiber. Applicants believe that this concurrent impingement results in a reduction of temperature gradients in the target zone. This in turn aids in the production of crystal fibers with high optical quality. In the absence of the graded reflectivity mirror, there is excessive heating of the newly grown crystal fiber which makes the growth process unstable. Hence, it is essential to have a laser beam having a substantially constant intensity profile through its cross sectional area. This aspect of the invention is in contrast to the system disclosed in U.S. Pat. No. 4,421,721 wherein the second laser beam having an annular intensity profile through its cross sectional area is focused upon only the tip of the solid feed material to produce molten feed material.

Yet another aspect of the present invention teaches that the means located within the fiber growth chamber to support the seed fiber above the molten feed material be positioned at a predetermined height above the molten feed. This predetermined height provides the seed fiber with sufficient resiliency so that surface tension in the molten material can move the seed fiber to the center of the molten feed material irrespective of where the seed fiber makes contact with the molten feed material. As a result, laborious concentric alignment of the seed fiber with the molten feed material is not necessary. This aspect is in contrast to the system disclosed in U.S. Pat. No. 4,421,721 wherein the means to support a seed fiber is positioned closer to the molten feed material requiring the use of a shorter seed fiber. This shorter seed fiber does not have sufficient height to provide the necessary resiliency. Surface tension in the molten feed material is unable to move the shorter seed fiber to the center of the molten feed material. Consequently, the shorter seed fiber must be concentrically aligned with the center of the molten feed material prior to its translation towards the molten feed material in order to produce crystal fibers of good optical quality.

In addition, the present invention requires the fiber growth chamber to have an internal atmosphere composed substantially of Helium gas. Helium gas is believed to be the most effective gas for suppressing the evaporation of the molten feed material without causing a serious problem as a result of entrapment into the molten feed material by turbulence within the molten feed material. Entrapped gas within the molten feed material leads to defects in the grown crystal fiber which cause scattering loss within the crystal fiber. The use of the fiber growth chamber with the above mentioned internal atmosphere is in contrast to the system disclosed in U.S. Pat. No. 4,421,721 wherein no mention is made regarding the composition of the atmosphere of the "enclosed chamber."

Also it should be noted that the present invention is particularly useful in growing sapphire crystal fibers. Further features of the present invention will become apparent from the following detailed description and the following drawings.

DETAILED DESCRIPTION OF PREFERRED EMBODIMENTS

Figure 1:
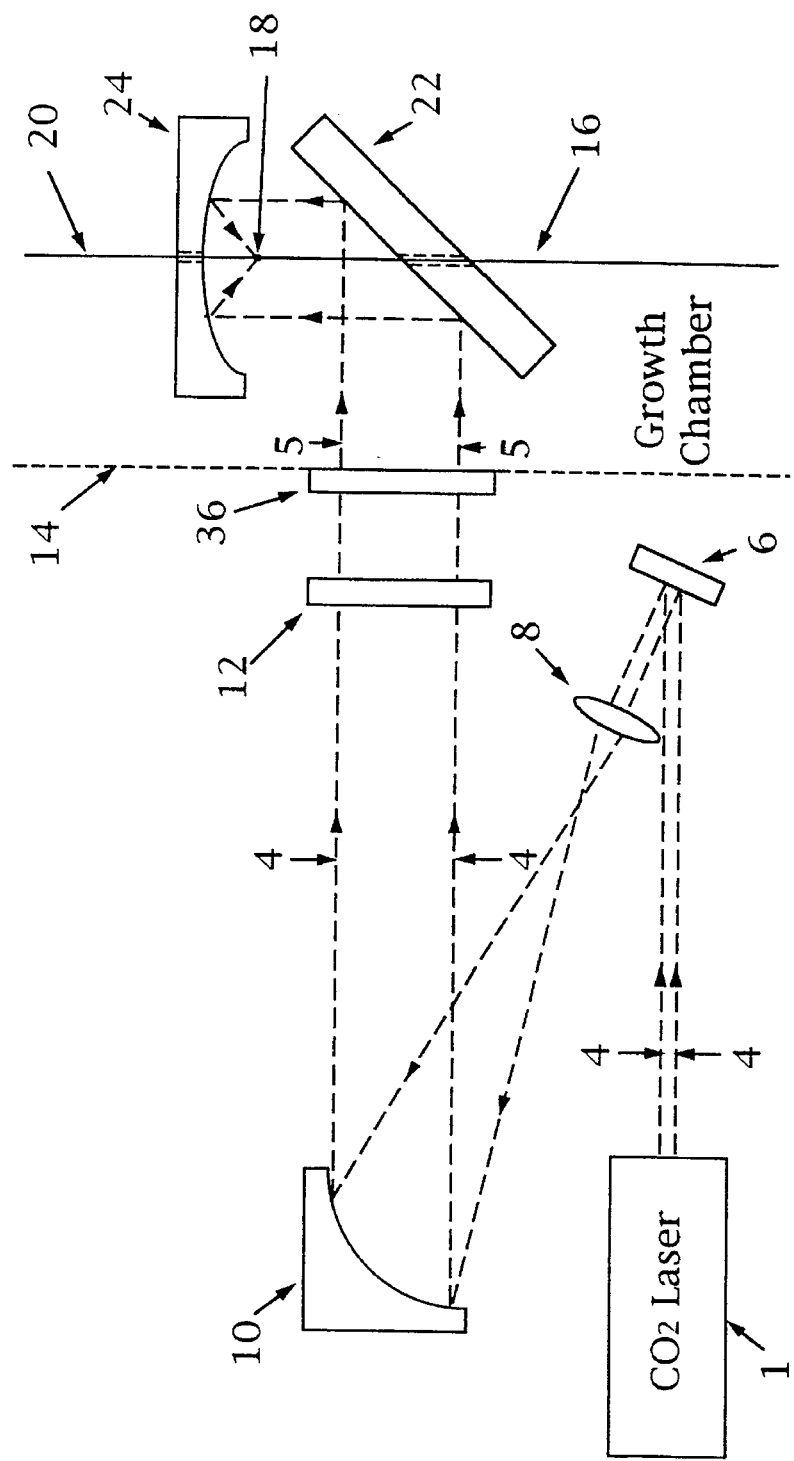
FIG. 1 is an illustration of the system according to the present invention and a trace of the laser beam path therein.
Figure 4:
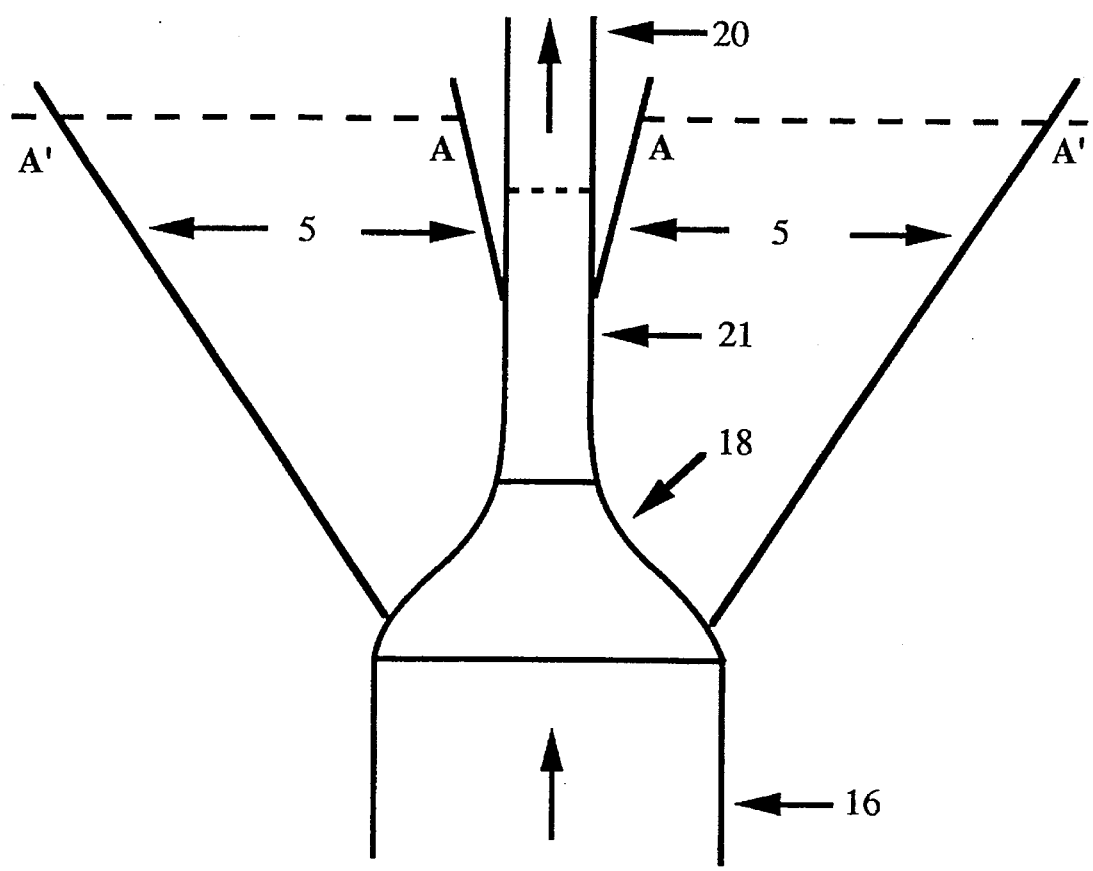
FIG. 4A is an illustration of the target zone employed in the present invention, showing that the laser beam strikes the molten zone as well as a portion of grown crystal fiber.
FIG. 4B is a graphical comparison of the intensity profiles of the laser beam having a substantially constant intensity profile through its cross sectional area and the intensity profile of the previously generated laser beam having a conventional gaussian intensity profile through its cross sectional area.
Figure 4:
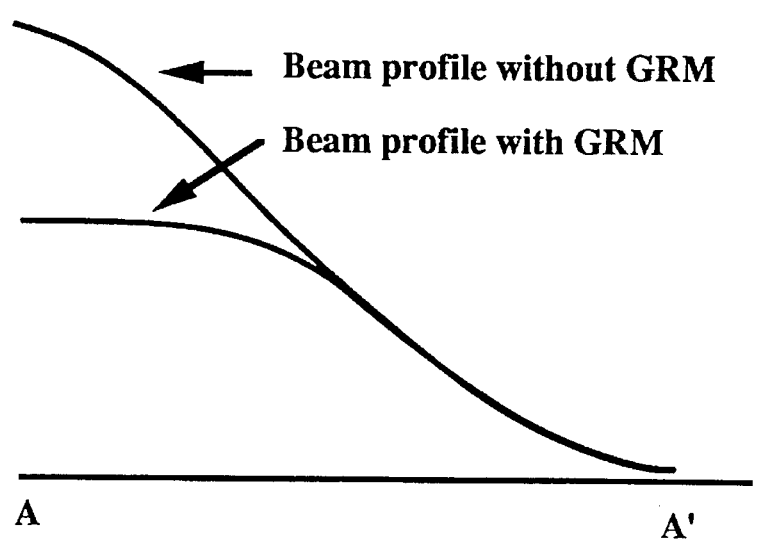

FIG. 1 shows the creation of a laser beam having a substantially constant intensity profile through its cross sectional area by transforming a previously generated laser beam having a conventional gaussian intensity profile through its cross sectional area into a second laser beam having a substantially constant intensity profile through its cross sectional area. The $CO_2$ laser 1 produces the previously generated laser beam having a conventional gaussian intensity profile through its cross sectional area 4 with a wavelength of 10 um. The upper curve in FIG. 4B is a graphical representation of the intensity profile of the conventional gaussian intensity profile through the cross sectional area of the previously generated laser beam 4. The previously generated laser beam 4 then strikes mirror 6 and is reflected towards lens 8. In the preferred embodiment of the present invention, lens 8 is composed of ZnSe and has a focal length of 3.8 cm. Lens 8 fills laser beam 4 onto a gold-coated off axis parabolic mirror 10. In the preferred embodiment of the present invention, mirror 10 has a focal length of 15 cm with a reflection angle of 30 degrees. Lens 8 and mirror 10 together form a beam expander. Passing the previously generated laser beam 4 through a telescopic device would be equivalent to passing it through lens 8 and reflecting it off mirror 10.

Figure 2:
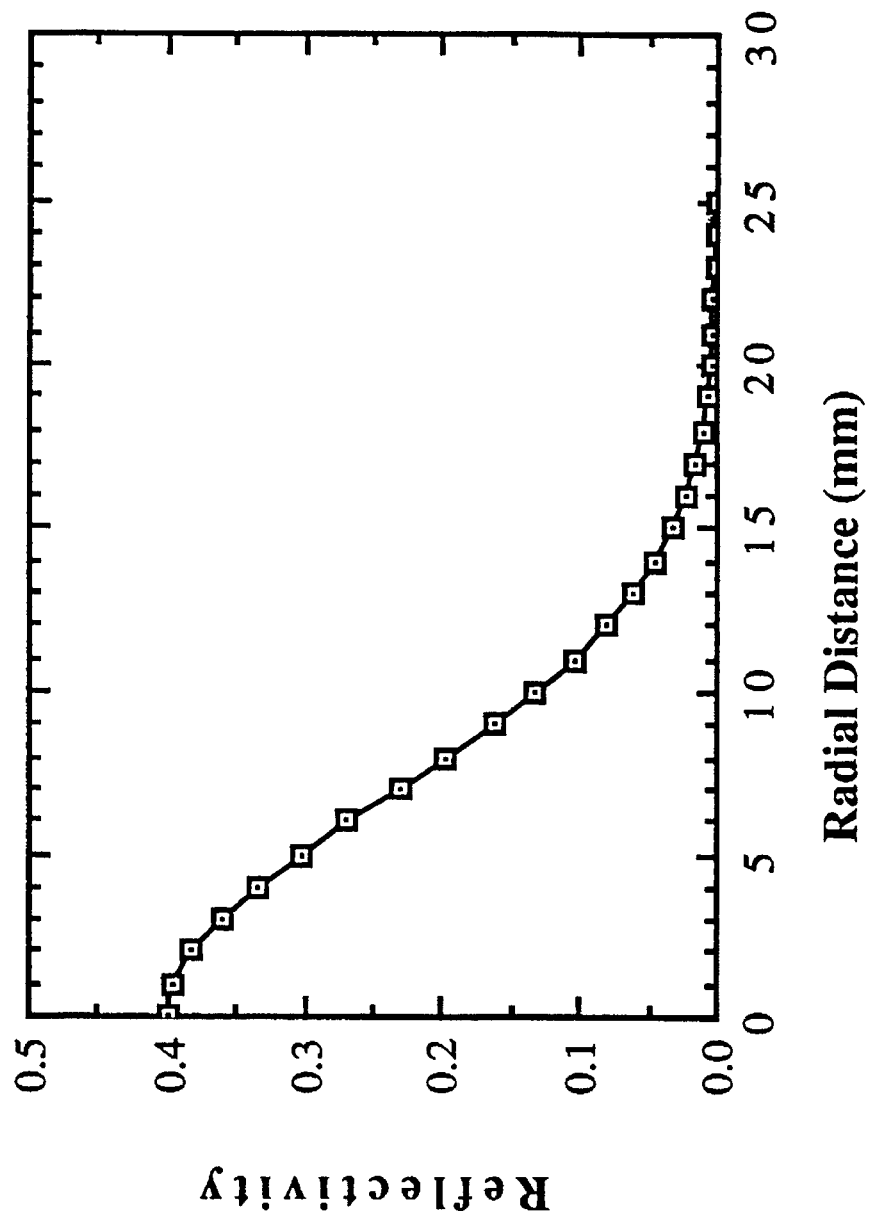
FIG. 2 is a graph of the reflectivity profile of the graded reflectivity mirror employed in the present invention.

After magnification, the previously generated laser beam 4 is passed through graded reflectivity mirror 12. Graded reflectivity mirror 12 transforms the previously generated laser beam 4 into a second laser beam having a substantially constant intensity profile through its cross sectional area 5. FIG. 2 is a graphical representation of the graded reflectivity mirror's reflectivity as a function of radial distance. The lower curve in FIG. 4B is a graphical representation of the intensity profile of the second laser beam having a substantially constant intensity profile through its cross sectional area, as used in the preferred embodiment. The applicants believe that any laser beam having an intensity profile which does not substantially change over a large fraction of its full width at half maximum is an acceptable equivalent of the second laser beam 5.

Referring again to FIG. 1, the previously generated laser beam 4 is transformed by graded reflectivity mirror 12 into the second laser beam 5. The second laser beam 5 then penetrates into the interior of the fiber growth chamber 14 via window 36. In the preferred embodiment of the present invention, the window 36 is composed of ZnSe. Once the second laser beam 5 has penetrated into the interior of the fiber growth chamber 14, the second laser beam 5 is directed at the target zone. The means to direct the second laser beam 5 at the target zone consists of scraper mirror 22 and fixed parabolic mirror 24. In the preferred embodiment of the present invention, fixed parabolic mirror 24 has a focal length of 3.6 cm. Fixed parabolic mirror 24 has a small aperture at its center through which a seed fiber 20 is translated towards the molten feed material 18. Because of its sufficient length, the seed fiber 20 has a sufficient resiliency. As a result, when the seed fiber 20 makes initial contact with the molten feed material 18, surface tension in the molten feed material moves the seed fiber 20 to the center of the molten feed material 18 irrespective of where the seed fiber 20 makes contact with the molten feed material 18. Seed fiber 20 fused to the molten feed material 18 is then withdrawn away from the molten feed material 18 through the aperture in the center of fixed parabolic mirror 24, whereby the molten feed material 18 is drawn off in the form of crystal fiber 21 through the target zone. Solid feed material 16 is translated towards the target zone through a small aperture in scraper mirror 22 in order to form new molten feed material 18 to replace the molten feed material 18 drawn off in the form of crystal fiber 21.

Figure 3:
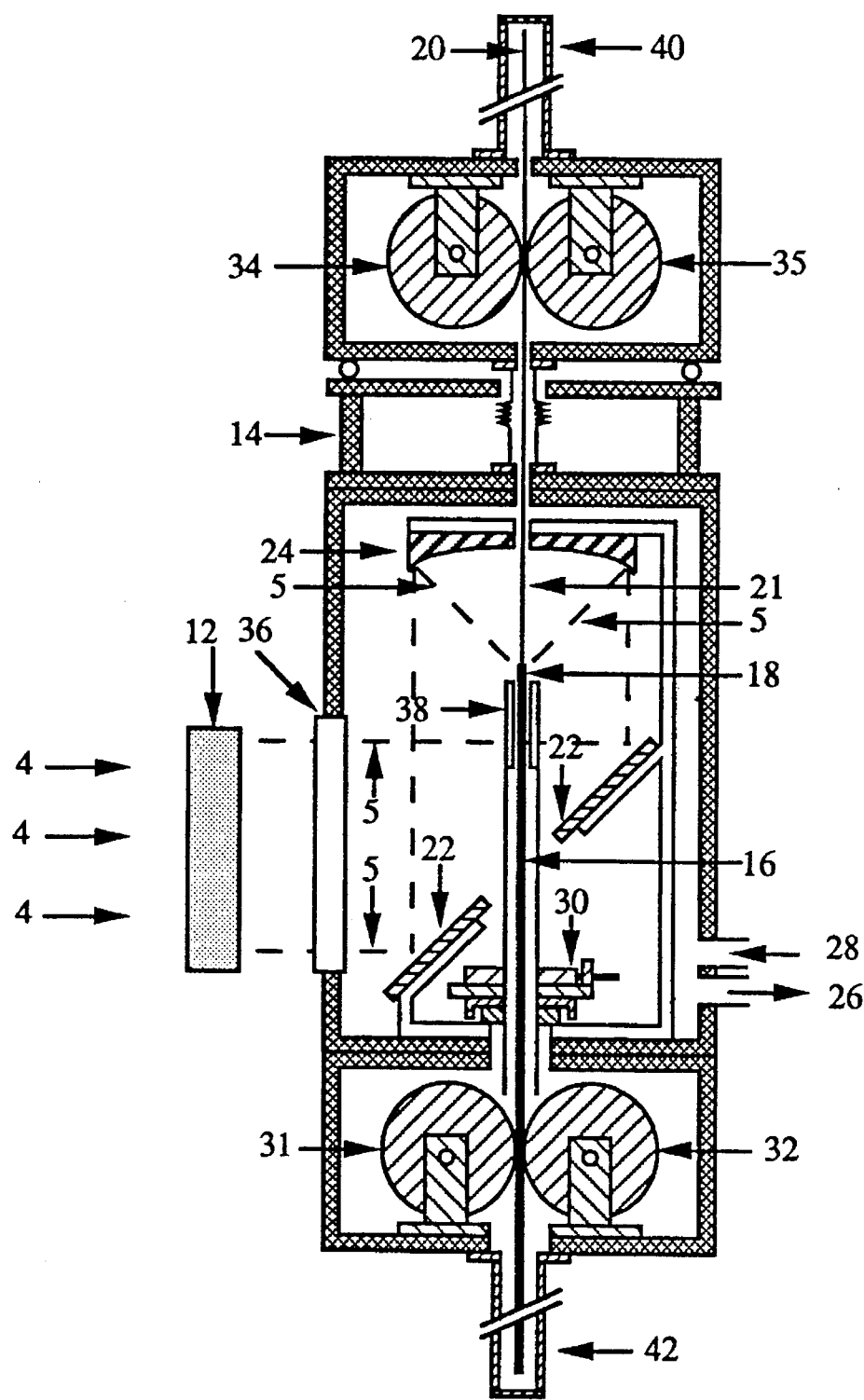
FIG. 3 is a schematic cross-section longitudinal view of the fiber growth chamber employed in the present invention.

FIG. 3 is a schematic cross-section longitudinal view of the fiber growth chamber 14. In the preferred embodiment of the present invention, the fiber growth chamber 14 is composed of aluminum compartments bolted together. However, any chamber capable of being evacuated is an acceptable equivalent.

In order to use the present invention, certain preparatory steps regarding the fiber growth chamber 14 must be taken. Initially the seed fiber 20 and the solid feed material 16 are installed into the fiber growth chamber 14. In the preferred embodiment of the present invention, the seed fiber 20 has a length of approximately 9 cm. Stainless steel roller 34 with a v-groove on its circumference and a motor driven rubber cylinder 35 support the seed fiber 20 in place. Seed fiber 20 is then passed through the aperture at the center of the fixed parabolic mirror 24 and positioned so that it is able to make contact with the molten feed material 18 once the molten feed material 18 is formed. A similar method is used to support the solid feed material 16 in place. A second steel roller 31 with a v-groove on its circumference and a second motor driven rubber cylinder 32 hold the solid feed material 16 in place. Solid feed material 16 is then passed through the translation stage assembly 30, the aperture in scraper mirror 22 and capillary guide 38. The tip of solid feed material 16 is positioned so that it will lie within the target zone. A visible laser beam overlapped with the second laser beam may be used to determine the position of the tip of solid feed material 16. If the tip of the solid feed material 16 does not lie within the target zone, the translation stage assembly 30 is used to translate capillary guide 38, and hence solid feed material 16, so that the tip of solid feed material 16 lies within the target zone. In the preferred embodiment of the present invention, the solid feed material 16 and the seed fiber 20 are composed of sapphire crystal.

In the preferred embodiment of the present invention, the length of solid feed material 16 installed in fiber growth chamber 14 is dependent upon the length and diameter of the crystal fiber 21 one wishes to grow. Since the fiber growth chamber is not capable of accommodating larger lengths of crystal fiber 21 fused to the seed fiber 20 (greater than 20 cm), vacuum tube 40 is attached to the fiber growth chamber. Grown crystal fiber 21 fused to the seed fiber 20 remain in vacuum tube 40 until the entire crystal fiber 21 is grown. Hence the length of vacuum tube 40 is dependent upon the length of crystal fiber 21 desired. A second vacuum tube 42 performs the analogous function regarding the length of solid feed material 16.

Referring again to FIG. 3, once the solid feed material 16 and the seed fiber 20 are installed into the fiber growth chamber 14 as stated above, air inside the fiber growth chamber 14 is evacuated through gas outlet 26 until a substantial vacuum ($10^{-3}$ Torr) is formed within the fiber growth chamber 14. Helium gas is then introduced into the fiber growth chamber 14 through gas inlet 28.

Referring again to FIG. 1, the previously generated laser beam 4 is transformed into the second laser beam 5 as stated above. Second laser beam 5 penetrates into the interior of the fiber growth chamber 14 through window 36, strikes scraper mirror 22 and is reflected at an angle of 90 degrees toward fixed parabolic mirror 24. The second laser beam 5 then strikes fixed parabolic mirror 24 which directs the second laser beam 5 to the target zone. In the target zone, the second laser beam 5 strikes a portion of solid feed material 16 forming molten feed material 18. Seed fiber 20 is then translated by stainless steel roller 34 and motor driven rubber cylinder 35 towards the molten feed material 18 so that seed fiber 20 can make contact with the molten feed material 18. Once this contact is made, surface tension in the molten feed material 18 moves the seed fiber 20 to the center of molten feed material 18 irrespective of where the seed fiber 20 makes initial contact with molten feed material 18.

After the seed fiber 20 is centered in the molten feed material 18 and fused with the molten feed material 18, stainless steel roller 34 and motor driven rubber cylinder 35 withdraw the seed fiber 20 away from the molten feed material 18 whereby the molten feed material 18 is drawn off in the form of crystal fiber 21 fused to the seed fiber 20 through the target zone. The second stainless steel roller 31 and the second motor driven rubber cylinder 32 translate the solid feed material 16 towards the target zone in order to replace molten feed material 18 drawn off in the form of crystal fiber 21 fused to the seed fiber 20 through the target zone. The rate at which the seed fiber 20 fused to newly crystal fiber 21 is withdrawn away from the molten feed material 18 and the rate at which the solid feed material 16 is translated towards the target zone determine the reduction in the diameter from the solid feed material 16 to the crystal fiber 21. Once the fiber growth process has been initiated, the focusing of the second laser beam 5 upon the target zone is as illustrated in FIG. 4A. After growth of the crystal fiber 21 is completed, it is annealed in a clean oven at 1200° C. for 24 hours. The annealed crystal fiber 21 is then cut to length and polished at the ends.

Employing the preferred embodiments, the present invention has grown sapphire crystal fibers of excellent transmission quality at a rate of 20 mm/min having a length of 3 m and a diameter of 100 um. Many other variations and modifications of the present invention will be apparent to those skilled in the art without departing from the spirit and scope of the present invention. The above-described embodiments are, therefore, intended to be merely exemplary, and all such variations and modifications are intended to be included within the scope of the invention as defined in the appended claims.

What is claimed is:

1. An improved laser heated pedestal growth system comprising:

means for creating a laser beam having a substantially constant intensity profile through its cross sectional area;

means for directing said laser beam at crystalline sapphire feed material located within a fiber growth chamber having an internal atmosphere composed substantially of helium gas to form molten sapphire feed material;

means to support a crystalline sapphire seed fiber above said molten sapphire feed material;

means to move said crystalline sapphire seed fiber towards and away from said molten sapphire feed material so that said crystalline sapphire seed fiber can make contact with said molten sapphire feed material, fuse to said molten sapphire material and then be withdrawn away from said molten sapphire feed material whereby said molten sapphire feed material is drawn off in the form of a crystalline sapphire fiber.

2. System as defined in claim 1 wherein crystalline sapphire seed fiber is positioned above said molten sapphire feed material by a distance sufficient so that surface tension in said molten sapphire feed material can move said crystalline sapphire seed fiber to the center of said molten sapphire feed material irrespective of where said crystalline sapphire seed fiber makes initial contact with said molten sapphire feed material.

3. System as defined in claim 2 wherein said means for directing said laser beam at a portion of said crystalline sapphire feed material to form said molten sapphire feed material is configured to direct said laser at a target zone which contains said molten sapphire feed material and a portion of said crystalline sapphire fiber drawn off by said crystalline sapphire seed fiber.

4. A method for producing crystal sapphire fibers comprising:
   creating a laser beam having a substantially constant intensity profile through its cross sectional area,
   providing a fiber growth chamber having a helium atmosphere,
   directing said laser beam at a solid feed material in said chamber thereby forming molten sapphire feed material within the fiber growth chamber,
   supporting a seed fiber within the fiber growth chamber at a predetermined height above the molten feed material, the seed fiber having a sufficient length and sufficient resiliency such that surface tension in the molten sapphire feed material can move the seed fiber to the center of the molten sapphire feed material irrespective of where the seed fiber makes initial contact with the molten sapphire feed material;
   moving the seed fiber towards and then away from the molten sapphire feed material so that the seed fiber can make contact with the molten sapphire feed material, be moved to the center of the molten sapphire feed material, fuse to the molten sapphire feed material, and then be withdrawn away from the molten sapphire feed material whereby the molten sapphire feed material is drawn off in the form of a crystal fiber.

5. A method for producing crystal fibers as recited in claim 4, where in the fiber growth chamber has an internal atmosphere composed substantially of helium gas.

6. A method for producing crystal sapphire fibers as recited in claim 5, wherein said laser beam is directed at a target zone which contains the molten sapphire feed material and a portion of crystal fiber drawn off by the seed fiber.

7. A method for producing crystal sapphire fibers as recited in claim 6 wherein said laser beam having a substantially constant intensity profile through its cross sectional area is produced by passing a previously generated laser beam having a conventional gaussian intensity profile through its cross sectional area through a graded reflectivity mirror.

8. A process for growing a sapphire crystal fiber comprising directing a laser beam having a substantially constant intensity profile through its cross sectional area at solid sapphire feed material in a target zone having a helium atmosphere to thereby form molten sapphire feed material in said target zone,
   contacting a sapphire seed fiber with the molten sapphire feed material in said target zone, and
   withdrawing said seed fiber from said target zone to thereby grow said crystal fiber on said seed crystal.

9. The process of claim 8, wherein said seed fiber is elongated and exhibits an inherent resiliency, said seed fiber being supported for movement towards and away from said target zone at a support location spaced from said target zone by a distance sufficient so that the surface tension of said molten sapphire feed material automatically centers said seed fiber in said molten sapphire feed material.

10. The process of claim 9, wherein molten sapphire feed material fuses to said seed fiber thereby forming said sapphire crystal fiber as said seed fiber is withdrawn from said target zone, said process further comprising continuing to supply additional amounts of solid feed material to said target zone and continuing to withdraw said seed fiber and said crystal fiber from said target zone so that an elongated crystal sapphire fiber is grown.

11. The process of claim 10, wherein said crystal sapphire fiber defines a tip in contact with the molten feed material in said target zone, a first portion of said laser beam striking molten sapphire feed material in said target zone and a second portion of said laser beam striking said tip.

12. The process of claim 11, wherein said laser beam having a substantially constant intensity profile through its cross sectional area is produced by directing a laser beam having a substantially gaussian profile through a graded reflectivity mirror.

13. The process of claim 11, wherein said process is carried out under a substantial vacuum.

14. Apparatus for growing a crystal fiber, said apparatus comprising
   a feed system for feeding a solid feed material to a target zone, said target zone having a helium atmosphere,
   a laser assembly capable of generating a laser beam having a substantially constant intensity profile through its cross sectional area, said assembly directing said laser beam at the solid feed material in said target zone for forming molten feed material in said target zone, and
   a product withdrawal assembly for contacting a seed crystal with said molten feed material and for withdrawing said seed crystal and crystal fiber grown on said seed crystal from said target zone.

15. The apparatus of claim 14, further comprising a helium supply system for supplying an atmosphere of helium to said target zone.

16. The apparatus of claim 15, wherein said apparatus further comprises a housing defining a chamber, said target zone being located in said chamber, said chamber including an atmosphere comprising helium.

17. The apparatus of claim 16, wherein said seed fiber and the crystal fiber grown thereon are elongated and exhibit an inherent resiliency, said product withdrawal assembly supporting said seed fiber and said crystal fiber grown thereon at a support location spaced from said target zone by a distance sufficient so that the surface tension of said molten feed material automatically centers said seed fiber and said crystal fiber grown thereon in said molten feed material.

18. The apparatus of claims 17, wherein said crystal fiber defines a tip in contact with the molten feed material in said target zone, said laser assembly being arranged to direct said laser beam so that a first portion of said laser beam strikes molten feed material in said target zone and a second portion of said laser beam strikes said tip.

19. The apparatus of claim 18, wherein said laser assembly includes a laser generating a laser beam with a substantially gaussian profile and a graded reflectivity mirror.

20. The apparatus of claim 14, wherein said seed fiber and the crystal fiber grown thereon are elongated and exhibit an inherent resiliency, said product withdrawal assembly supporting said seed fiber and said crystal fiber grown thereon at a support location spaced from said target zone by a distance sufficient so that the surface tension of said molten feed material automatically centers said seed fiber and said crystal fiber grown thereon in said molten feed material.

21. The apparatus of claim 20, wherein said crystal fiber defines a tip in contact with the molten feed material in said target zone, said laser assembly being arranged to direct said laser beam so that a first portion of said laser beam strikes molten feed material in said target zone and a second portion of said laser beam strikes said tip.

22. The apparatus of claim 21, wherein said laser assembly includes a laser generating a $CO_2$ laser beam with a substantially gaussian profile and a graded reflectivity mirror.

23. The apparatus of claim 14, wherein said crystal fiber defines a tip in contact with the molten feed material in said target zone, said laser assembly being arranged to direct said laser beam so that a first portion of said laser beam strikes molten feed material in said target zone and a second portion of said laser beam strikes said tip.

24. The apparatus of claim 23, wherein said laser assembly includes a $CO_2$ laser generating a laser beam with a substantially gaussian profile and a graded reflectivity mirror.

25. The apparatus of claim 14, wherein said laser assembly includes a $CO_2$ laser generating a laser beam with a substantially gaussian profile and a graded reflectivity mirror.

* * * * *